(12) United States Patent
Miyazaki

(10) Patent No.: US 10,976,581 B2
(45) Date of Patent: Apr. 13, 2021

(54) DISPLAY DEVICE

(71) Applicant: Sharp Kabushiki Kaisha, Sakai (JP)

(72) Inventor: Shinichi Miyazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/483,474

(22) PCT Filed: Feb. 2, 2018

(86) PCT No.: PCT/JP2018/003613
§ 371 (c)(1),
(2) Date: Aug. 5, 2019

(87) PCT Pub. No.: WO2018/143412
PCT Pub. Date: Aug. 9, 2018

(65) Prior Publication Data
US 2020/0019009 A1 Jan. 16, 2020

(30) Foreign Application Priority Data
Feb. 6, 2017 (JP) .............................. JP2017-019467

(51) Int. Cl.
*G02F 1/1333* (2006.01)
*G06F 3/041* (2006.01)
(Continued)

(52) U.S. Cl.
CPC ...... *G02F 1/133308* (2013.01); *G02F 1/1362* (2013.01); *G02F 1/13338* (2013.01);
(Continued)

(58) Field of Classification Search
CPC ........... G02F 1/133308; G02F 1/13338; G02F 1/1362; G06F 3/0412; G06F 3/0416;
(Continued)

(56) References Cited

U.S. PATENT DOCUMENTS 6,943,705 B1 * 9/2005 Bolender .............. G06F 3/0445
341/33
8,248,086 B2 * 8/2012 Cooper ................ H03K 17/955
324/663
(Continued)

FOREIGN PATENT DOCUMENTS

JP 05-313144 A 11/1993
JP 2015-138125 A 7/2015
(Continued)

OTHER PUBLICATIONS

Official Communication issued in International Patent Application No. PCT/JP2018/003613, dated Apr. 3, 2018.

*Primary Examiner* — Amy Onyekaba
(74) *Attorney, Agent, or Firm* — Keating & Bennett, LLP

(57) ABSTRACT

The present invention provides a display device that can improve the detection sensitivity for detecting the approach of a user's face, hand, or the like. The display device 10 includes a display substrate D and a bezel 4 that covers side surfaces and a rear surface of the display substrate D. The bezel 4 includes a conductive section 4a and an insulating section 4b. The insulating section 4b covers the side surfaces and the rear surface of the display substrate D and has insulating properties. The conductive section 4a is provided on a surface of the insulating section 4b covering the side surfaces of the display substrate D and has conductivity. The conductive section 4a is configured such that a predetermined voltage is applied thereto and a capacitance is formed between the conductive section 4a and a dielectric object.

4 Claims, 5 Drawing Sheets

(51) Int. Cl.
*G06F 3/044* (2006.01)
*G02F 1/1362* (2006.01)
*H03K 17/945* (2006.01)

(52) U.S. Cl.
CPC ............ *G06F 3/044* (2013.01); *G06F 3/0412* (2013.01); *G06F 3/0416* (2013.01); *H03K 17/945* (2013.01)

(58) Field of Classification Search
CPC ... G06F 3/044; G06F 3/04166; H03K 17/945; H01H 36/00
See application file for complete search history.

(56) References Cited

U.S. PATENT DOCUMENTS

| | | | | |
|---|---|---|---|---|
| 10,394,404 | B2* | 8/2019 | Wang | G06F 3/0448 |
| 2001/0024257 | A1* | 9/2001 | Kubo | G02F 1/134336 |
| | | | | 349/138 |
| 2003/0202146 | A1* | 10/2003 | Takeda | G02F 1/133707 |
| | | | | 349/129 |
| 2006/0050018 | A1* | 3/2006 | Hutzel | B60R 1/12 |
| | | | | 345/60 |
| 2006/0238517 | A1* | 10/2006 | King | G06F 1/1626 |
| | | | | 345/173 |
| 2008/0283841 | A1* | 11/2008 | Yamayoshi | H01L 27/1255 |
| | | | | 257/71 |
| 2009/0153438 | A1* | 6/2009 | Miller | G09G 3/3225 |
| | | | | 345/55 |
| 2009/0244021 | A1* | 10/2009 | Matsuo | G06F 3/0443 |
| | | | | 345/173 |
| 2010/0013791 | A1* | 1/2010 | Haga | G06F 3/042 |
| | | | | 345/174 |
| 2010/0020041 | A1* | 1/2010 | Park | G06F 3/044 |
| | | | | 345/174 |
| 2010/0259503 | A1* | 10/2010 | Yanase | G06F 3/04166 |
| | | | | 345/174 |
| 2012/0068962 | A1* | 3/2012 | Yamamoto | G06F 1/1692 |
| | | | | 345/174 |
| 2012/0162055 | A1* | 6/2012 | Hara | G02F 1/1362 |
| | | | | 345/92 |
| 2012/0218494 | A1* | 8/2012 | Nakayama | G02F 1/1336 |
| | | | | 349/60 |
| 2013/0235298 | A1* | 9/2013 | Harada | G02F 1/133308 |
| | | | | 349/58 |
| 2014/0233356 | A1* | 8/2014 | Pattikonda | G04G 9/0064 |
| | | | | 368/13 |
| 2014/0327843 | A1* | 11/2014 | Liu | G06F 3/0412 |
| | | | | 349/12 |
| 2015/0171916 | A1* | 6/2015 | Asrani | H04M 1/0202 |
| | | | | 455/575.7 |
| 2015/0261364 | A1* | 9/2015 | Cady | G06F 3/0488 |
| | | | | 345/173 |
| 2016/0018915 | A1* | 1/2016 | Kuo | G06F 3/0446 |
| | | | | 345/173 |
| 2016/0103544 | A1* | 4/2016 | Filiz | G06F 3/0416 |
| | | | | 345/174 |
| 2016/0202813 | A1* | 7/2016 | Lee | G06F 3/0443 |
| | | | | 345/174 |
| 2016/0202840 | A1* | 7/2016 | Ichihara | G06F 3/0418 |
| | | | | 345/174 |
| 2016/0378225 | A1* | 12/2016 | Wang | G06F 3/0446 |
| | | | | 345/174 |
| 2017/0285771 | A1* | 10/2017 | Jung | G06F 3/0442 |
| 2019/0155435 | A1* | 5/2019 | Park | H01L 27/323 |

FOREIGN PATENT DOCUMENTS

| | | |
|---|---|---|
| JP | 2016-009414 A | 1/2016 |
| JP | 2016-033830 A | 3/2016 |
| JP | 2016-062156 A | 4/2016 |

* cited by examiner

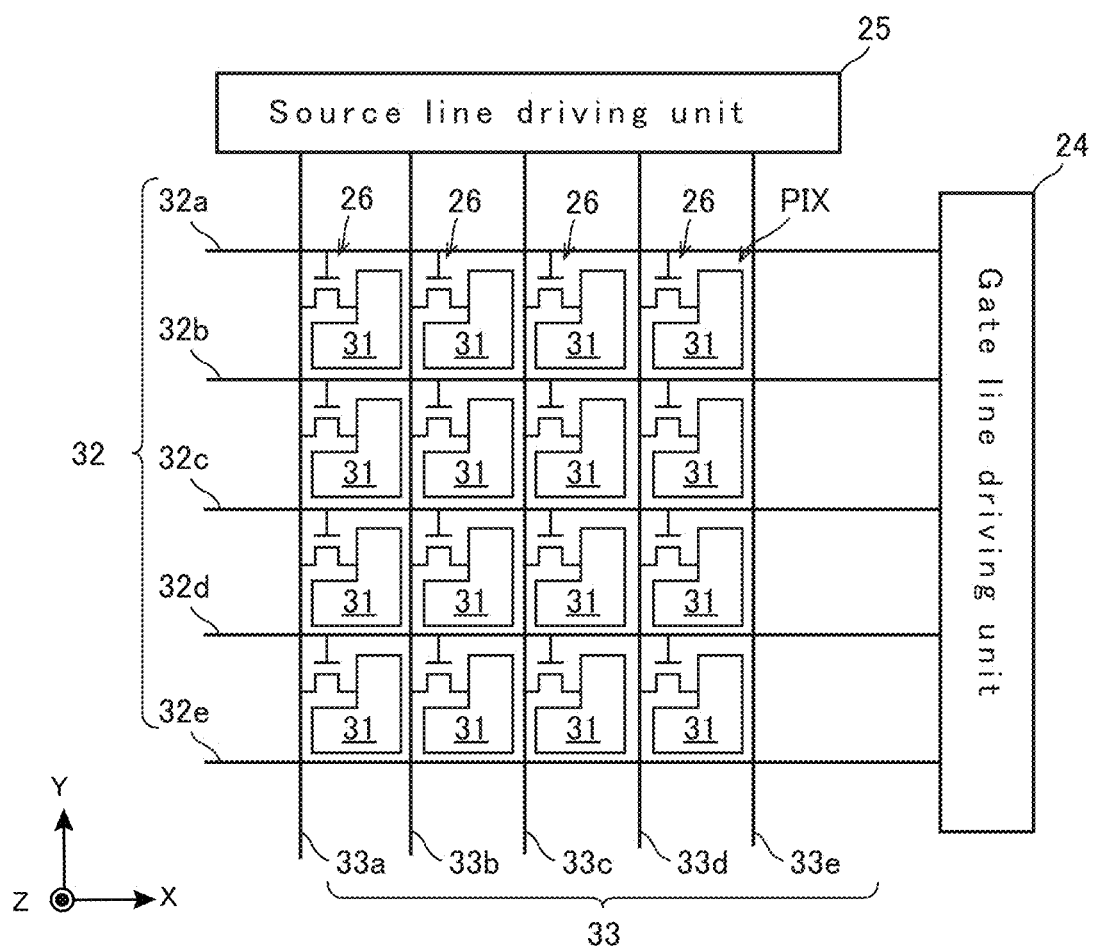
F I G. 3

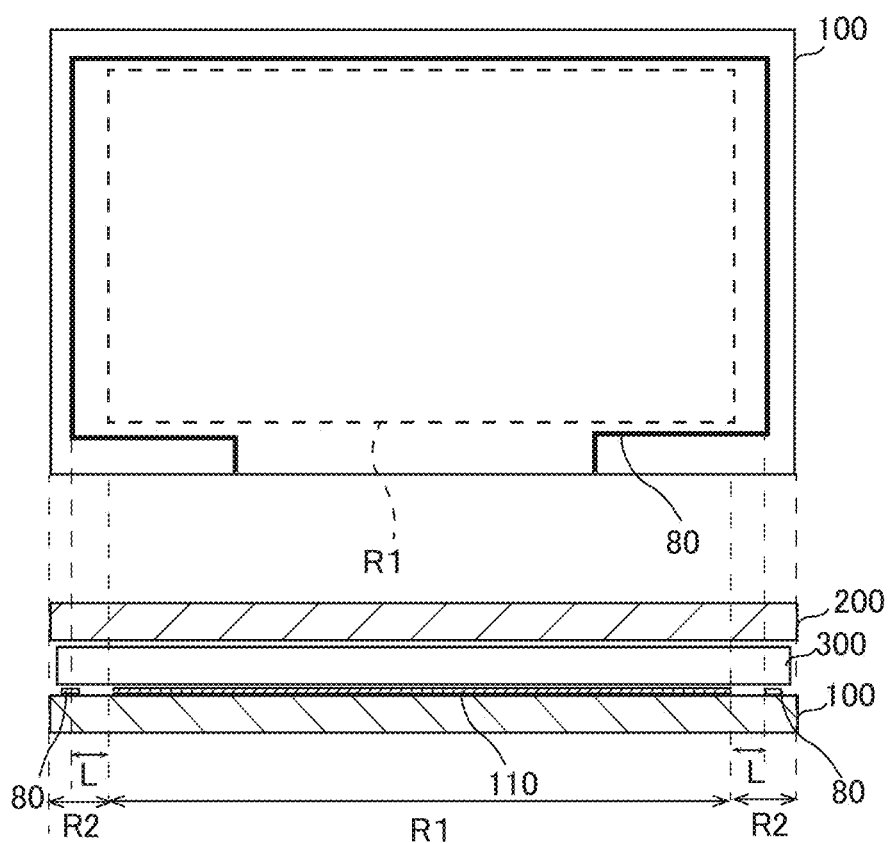
F I G. 6

DISPLAY DEVICE

TECHNICAL FIELD

The present invention relates to a display device.

BACKGROUND ART

JP 2016-009414 A and JP 2016-033830 A disclose touch panel built-in display devices, such as smartphones, provided with a proximity sensor. In such touch panel built-in display devices, malfunctions of the touch panel are prevented by detecting the presence of a user's face, ear, or the like in proximity to the smartphone when the user makes a phone call and controlling the touch panel on the basis of the detection result.

SUMMARY OF INVENTION

When a capacitive sensor is used as a proximity sensor, the proximity sensor may be disposed as shown in FIG. 6, for example. In FIG. 6, a proximity sensor 80 is provided on a display substrate that includes an active matrix substrate 100, a counter substrate 200, and a liquid crystal layer 300 that is sealed between the active matrix substrate 100 and the counter substrate 200 with a sealant (not shown). In this display substrate, the proximity sensor 80 is wired in a frame region R2 on the active matrix substrate 100, i.e., wired on the outside of a display region R1 so as to surround the display region R1. The proximity sensor 80 is configured such that a predetermined voltage is applied thereto from an external control circuit and a capacitance is formed between the proximity sensor 80 and a dielectric object approaching thereto. The control circuit detects whether a user's face, hand, or the like has approached on the basis of a change in the capacitance in the proximity sensor 80. When a capacitive touch panel and a proximity sensor are built in a display device, the shorter the distance from the proximity sensor 80 to the touch panel, a circuit element 110 of a display circuit, or the like provided on the display substrate, the greater the parasitic capacitance between the proximity sensor 80 and the circuit element 110 or the like. As a result, it becomes difficult for the proximity sensor 80 to exhibit high detection sensitivity, and the approach of a user's face, hand, or the like cannot be detected correctly.

It is an object of the present invention to provide a display device that can detect the approach of a user's face, hand, or the like correctly.

A display device according to one embodiment of the present invention is a display device including: a display substrate; and a bezel that covers side surfaces and a rear surface of the display substrate, wherein the bezel includes: an insulating section that covers the side surfaces and the rear surface of the display substrate and has insulation properties; and a conductive section that is provided on a surface of the insulating section covering the side surfaces of the display substrate and has conductivity, and the conductive section is configured such that a predetermined voltage is applied thereto and a capacitance is formed between the conductive section and a dielectric object.

According to the present invention, the approach of a user's face, hand, or the like can be detected correctly.

BRIEF DESCRIPTION OF DRAWINGS

FIG. 3 is a plan view showing a schematic configuration of an active matrix substrate shown in FIG. 1.

FIG. 6 is a schematic view showing a conventional display device in which a proximity sensor is provided on an active matrix substrate.

DESCRIPTION OF EMBODIMENTS

Figure 1:
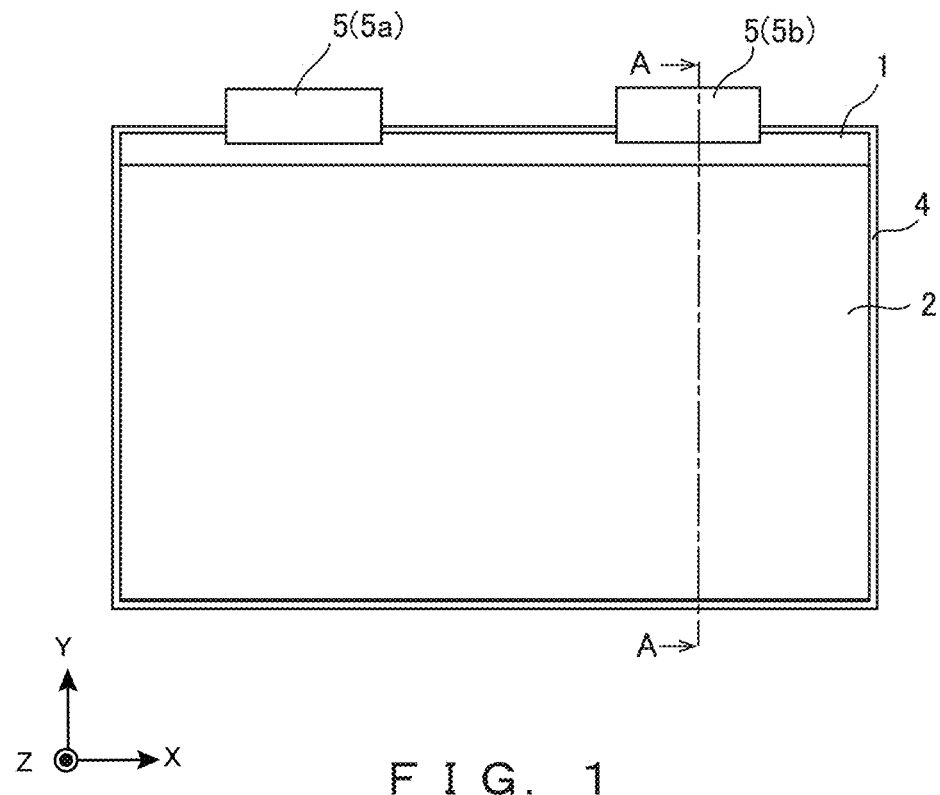
FIG. 1 is a top view showing a schematic configuration of a display device according to a first embodiment.

A display device according to one embodiment of the present invention is a display device including: a display substrate; and a bezel that covers side surfaces and a rear surface of the display substrate, wherein the bezel includes: an insulating section that covers the side surfaces and the rear surface of the display substrate and has insulation properties; and a conductive section that is provided on a surface of the insulating section covering the side surfaces of the display substrate and has conductivity, and the conductive section is configured such that a predetermined voltage is applied thereto and a capacitance is formed between the conductive section and a dielectric object (first configuration).

According to the first configuration, the bezel that covers the side surfaces and the rear surface of the display substrate includes the conductive section and the insulating section. The insulating section covers the side surfaces and the rear surface of the display substrate, and the conductive section is provided on a surface of the insulating section covering the side surfaces of the display substrate. The conductive section is configured such that a predetermined voltage is applied thereto and a capacitance is formed between the conductive section and a dielectric object. Whether a user's face, hand, or the like has approached can be detected on the basis of a change in the capacitance in the conductive section. The conductive section is provided on the surface of the insulating section provided on the side surfaces of the display substrate. That is, the conductive section is provided apart from the display substrate with the insulating section interposed therebetween. With this configuration, as compared with the case where a sensor for detecting the approach of a user's face, hand, or the like is provided on a display substrate, parasitic capacitances formed with other elements provided on the display substrate are reduced, whereby the detection sensitivity for detecting the approach of a dielectric object can be improved.

In the first configuration, the display device may be configured such that the display substrate is provided with a circuit element group for displaying an image and also for detecting a touched position and is connected to a control circuit for controlling the circuit element group, and a height of the bezel at a position to which the control circuit is connected is lower than a height of the bezel at other positions (second configuration).

According to the second configuration, as compared with the case where the height of the bezel is uniform at all positions, interference between the control circuit and the conductive section can be reduced, whereby the detection sensitivity can be improved.

In the first or second configuration, the display device may be configured such that the conductive section has an opening, and the display device includes: a flexible substrate that is connected to the control circuit and is connected to the display substrate at a position where the opening is provided; and a conductive member that connects both ends of the opening so as to cover the flexible substrate (third configuration).

According to the third configuration, the flexible substrate provided with the control circuit is connected to the opening of the conductive section. When the flexible substrate is connected to the display substrate so as to be overlaid on the conductive section, the conductive section is covered with the flexible substrate. In contrast, when the flexible substrate is connected to the display substrate via the opening of the conductive section, the conductive section is not covered with the flexible substrate. Moreover, since both ends of the opening are connected by the conductive member over the flexible substrate, it is possible to decrease the reduction in detection sensitivity in a region where the flexible substrate is provided.

In the third configuration, the display device may include a driving circuit that is connected to the conductive section and is configured to apply the predetermined voltage to the conductive section and to detect a change in the capacitance (fourth configuration).

According to the fourth configuration, whether a user's face, hand, or the like has approached can be detected with high accuracy on the basis of a change in the capacitance in the conductive section.

Embodiments of the present invention will be described below with reference to the drawings. Components/portions that are identical or equivalent to each other in the drawings are given the same reference numerals, and descriptions thereof are not repeated. For clarity of illustration, in the drawings to be referred to in the following description, structures may be shown in simplified or schematic forms, and some components may be omitted. The dimensional ratios between components shown in the respective drawings do not necessarily represent actual dimensional ratios.

First Embodiment

Figure 2:
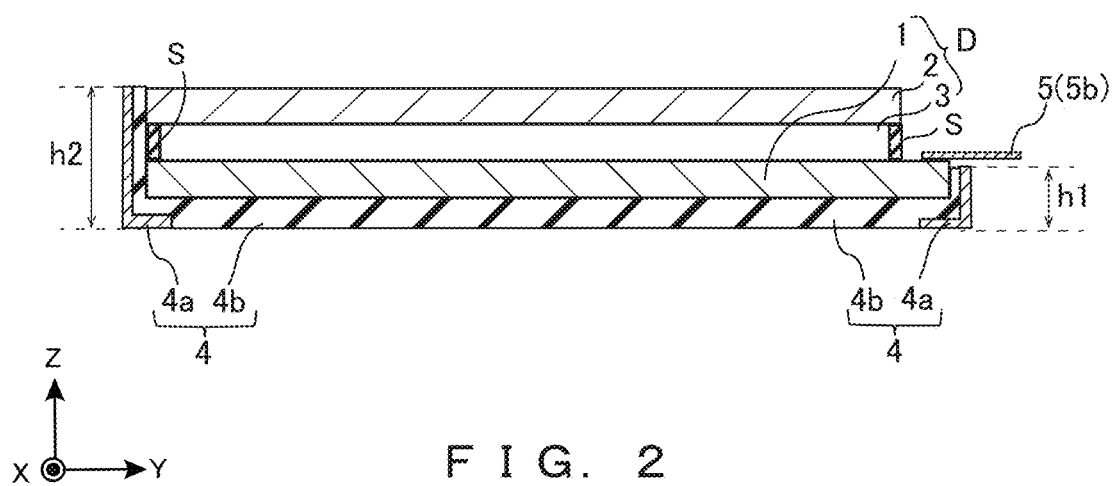
FIG. 2 is a sectional view of the display device taken along line A-A in FIG. 1.

FIG. 1 is a plan view showing a schematic configuration of a display device 10 according to the present embodiment, and FIG. 2 is a sectional view taken along line A-A in FIG. 1.

A display device 10 includes a display substrate D, which includes an active matrix substrate 1, a counter substrate 2, and a liquid crystal layer 3 sealed between the active matrix substrate 1 and the counter substrate 2 with a sealant S. Although not shown in FIG. 1, the display device 10 includes a backlight provided on a surface of the active matrix substrate 1 on the side opposite to the liquid crystal layer 3 side.

The periphery of the display substrate D is covered with a bezel 4. The counter substrate 2 is provided with a color filter (not shown). The counter substrate 2 has a smaller width in the Y-axis direction than the active matrix substrate 1. Flexible printed circuits (FPCs) 5 (5a, 5b) are connected to a region of the active matrix substrate 1 not overlapping with the counter substrate 2. The FPCs 5 are each provided with, e.g., an IC chip for controlling circuit elements provided on the display substrate D.

The display device 10 has a function of displaying an image and also a function of detecting a position touched by a user on the displayed image (touched position). The display device 10 is a display device with a so-called in-cell type touch panel, in which elements necessary for detecting the touched position are provided on the active matrix substrate 1. Although the present embodiment describes an example where the display device is a display device with an in-cell type touch panel, the display device may be a display device with an on-cell type touch panel, in which the touch panel is disposed on the counter substrate 2.

The configuration of the active matrix substrate 1 will now be described. FIG. 3 is a plan view showing a schematic configuration of the active matrix substrate 1 shown in FIG. 1. As shown in FIG. 3, on the active matrix substrate 1, a plurality of gate lines 32 and a plurality of source lines 33 that extend so as to cross the plurality of gate lines 32 are provided. Pixels PIX, which are constituted by the gate lines 32 and the sources lines 32, are each provided with a switching element 26 connected to the gate line 33 and to the source line 33 and a pixel electrode 31 connected to the switching element 26. The switching element 26 is a thin film transistor (TFT), for example.

In the display device 10, liquid crystal molecules contained in the liquid crystal layer 3 are driven in an in-plane switching mode. In order to achieve the in-plane switching mode, the pixel electrodes 31 and counter electrodes (also called "common electrodes"), which are both involved in electric field formation, are formed on the active matrix substrate 1.

Although not shown in FIG. 3, the counter electrodes are formed on a surface of the active matrix substrate 1 on the liquid crystal layer 3 side. The counter electrodes are each in a rectangular shape that is approximately square with each side thereof being about 4 mm, for example. The plurality of counter electrodes are arranged in matrix so as to overlap with the region where the pixel electrodes 31 are provided. The counter electrodes each have a slit (e.g., several micrometers in width) for generating an in-plane electric field between the counter electrodes and the pixel electrodes 31.

The plurality of gate lines 32 are connected to a gate line driving unit 24. The plurality of source lines 33 are connected to a source line driving unit 25. For example, the gate line driving unit 24 is provided in a frame region on the active matrix substrate 1, and the source line driving unit 25 is provided in the FPCs 5 (see FIGS. 1 and 2).

The gate line driving unit 24 applies gate line driving signals for switching the plurality of gate lines 32a, 32b, 32c, . . . to the selected state sequentially one by one for every single horizontal scanning period.

In an image display period, the source line driving unit 25 supplies data signals corresponding to the gradations of an image to be displayed to the source lines 33.

Furthermore, outside the display region on the active matrix substrate 1, a controller (not shown) connected to the counter electrodes (not shown) is provided. The controller performs image display control for displaying an image and touched position detection control for detecting a touched position in a time-sharing manner. During the operations as the touch panel, each of the counter electrodes (not shown) is driven as an independent sensor. During the operations as the display, the counter electrodes and the pixel electrodes 31 operate in pairs to perform the image display control.

Referring back to FIG. 2, the bezel 4 includes a conductive section 4a and an insulating section 4b. The insulating section 4b is formed of, for example, a resin material having insulating properties, and covers side surfaces and a rear surface of the display substrate D. The conductive section 4a is formed of, for example, a metal material having conductivity, and is provided on a surface of the insulating section 4b covering the side surfaces of the display substrate D. That is, in this example, the conductive section 4a is provided apart from the display substrate D with the insulating section 4b interposed therebetween.

The bezel 4 in the present embodiment is configured such that a predetermined voltage is applied to the conductive section 4a from a proximity detection driving circuit to be described below and a capacitance is formed between the conductive section 4a and a dielectric object such as a user's face or hand. The proximity detection driving circuit detects the approach of the dielectric object on the basis of a change in the capacitance in the conductive section 4a. That is, the bezel 4 not only functions as a frame into which the display substrate D is fitted but also has a function of detecting the approach of the dielectric object. It is to be noted that a state where the dielectric object has approached refers to a state where the dielectric object is apart from the bezel 4 by a certain distance and is different from a state where the dielectric object is in contact with the bezel 4.

Figure 4A:
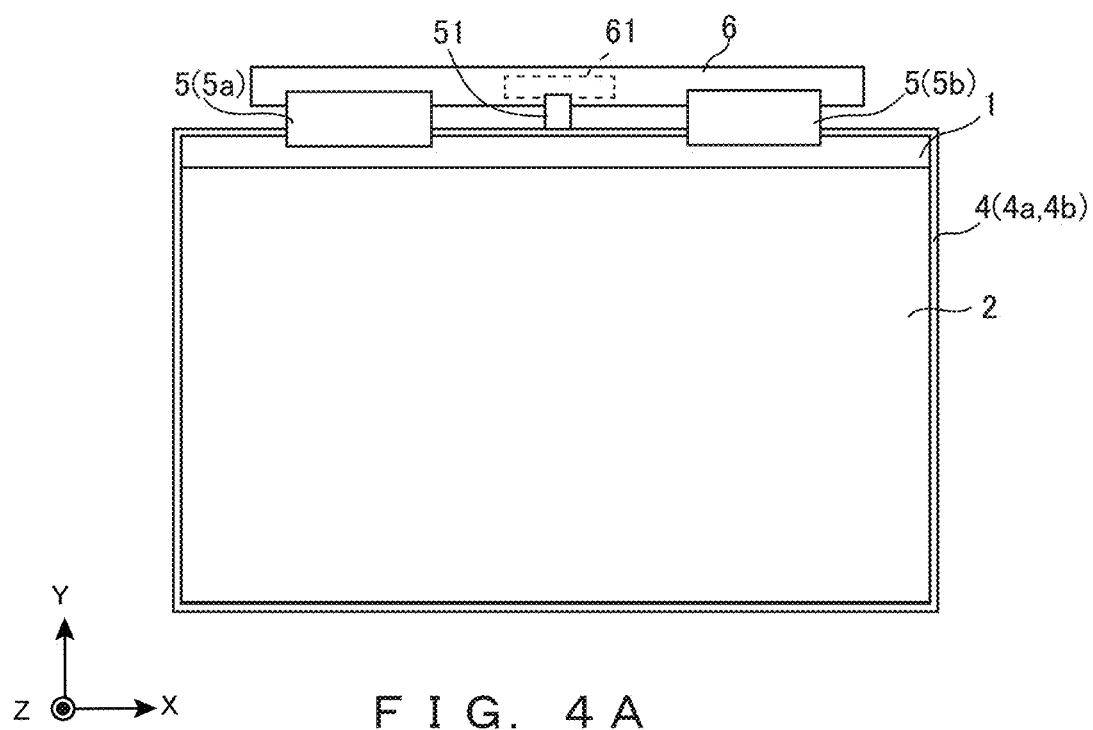
FIG. 4A is a schematic view showing an example of connection between a proximity detection driving circuit and a conductive section.
Figure 4B:
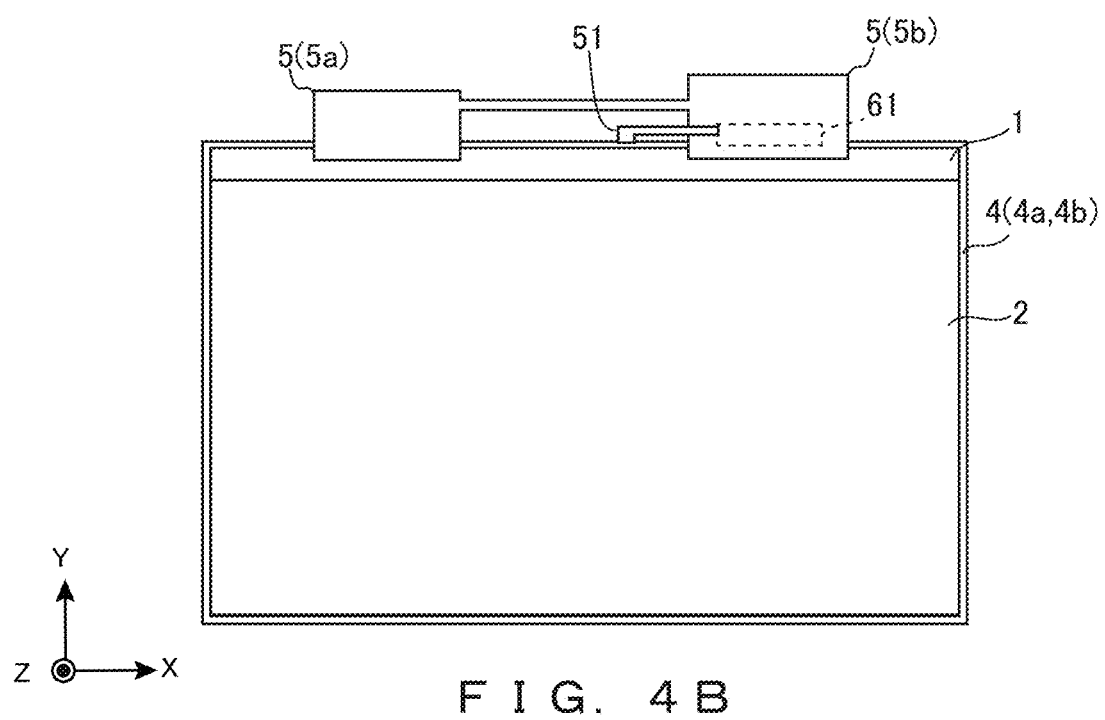
FIG. 4B is a schematic view showing another example of connection, which is different from the connection shown in FIG. 4A.

The proximity detection driving circuit may be connected to the conductive section 4a in a manner as shown in FIG. 4A or 4B. In FIG. 4A, the conductive section 4a of the bezel 4 is connected to a proximity detection driving circuit 61 provided on a rigid substrate 6 via a FPC 51.

Alternatively, as shown in FIG. 4B, the proximity detection driving circuit 61 may be disposed in either the FPC 5a or 5b, which is connected to the active matrix substrate 1 and equipped with the IC chip such as the source line driving unit 25, and the proximity detection driving circuit 61 may be connected to the conductive section 4a of the bezel 4 via the FPC 51. The above-described controller (not shown) may be disposed on the rigid substrate 6 shown in FIG. 4A or in the FPC 5a or 5b shown in FIG. 4B.

In the present embodiment, as shown in FIG. 2, the height h1 of the bezel 4 on a side to which the FPCs 5 (5a, 5b) are connected is lower than the height h2 of the bezel 4 on the other sides. With this configuration, interference between the IC chips provided in the FPCs 5 and the conductive section 4a can be decreased.

The proximity detection driving circuit 61 is connected to the above-described controller (not shown). The proximity detection driving circuit 61 applies a predetermined voltage to the conductive section 4a and detects the approach of a dielectric object during a period in which the controller does not perform the detection of a touched position. That is, the display device 10 performs the detection of a touched position and the detection of the approach of a dielectric object in a time-sharing manner.

In the first embodiment, the conductive section 4a of the bezel 4 functions as a proximity sensor. As shown in FIG. 2, the conductive section 4a is provided on a surface of the insulating section 4b covering the side faces of the display substrate D. That is, the conductive section 4a is provided apart from the display substrate D with the insulating section 4b interposed therebetween, and accordingly, the distance between the circuit elements provided on the active matrix substrate 1 and the conductive section 4a can be increased as compared with the case where, as shown in FIG. 6, the proximity sensor 80 is provided in the frame region R2 of the active matrix substrate 100. As a result, the parasitic capacitances formed between the circuit elements provided on the active matrix substrate 1 and the conductive section 4a are reduced, whereby the detection sensitivity for detecting the approach of a dielectric object can be improved in the conductive section 4a.

The conductive section 4a of the bezel 4 is provided only on the side surfaces of the display substrate D, and the rear surface of the display substrate D is constituted by the insulating section 4b. Accordingly, as compared with the case where the rear surface of the display substrate D is also constituted by a conductor, the parasitic capacitances formed with the circuit elements on the display substrate D can be reduced. As a result, the detection sensitivity for detecting the approach of a dielectric object can be improved.

Second Embodiment

In the above-described first embodiment, portions of the bezel 4 at the positions where the FPCs 5 are provided are covered with the FPCs 5. On each FPC 5, wires for connecting the circuit on the display substrate D to the controller for controlling the circuit are arranged densely. Accordingly, the portions of the bezel 4 covered with the FPCs 5 are shielded by the FPCs 5, whereby the detection sensitivity is likely to be reduced. On this account, the present embodiment describes the configuration of a bezel with which the reduction in detection sensitivity caused by the FPCs 5 is decreased.

Figure 5A:
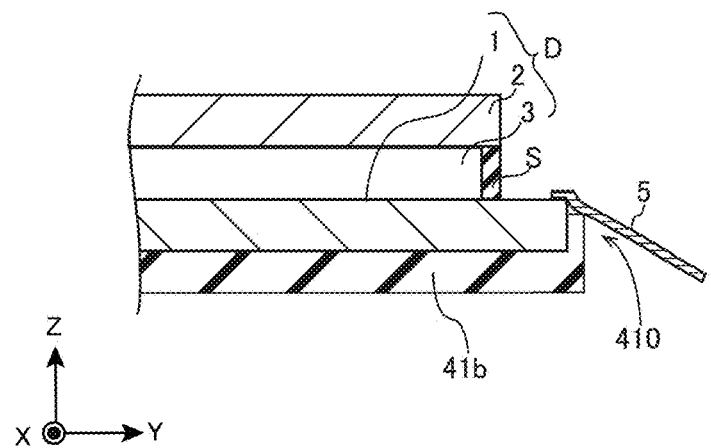
FIG. 5A is a sectional view showing a part of a display device according to a second embodiment.
Figure 5B:
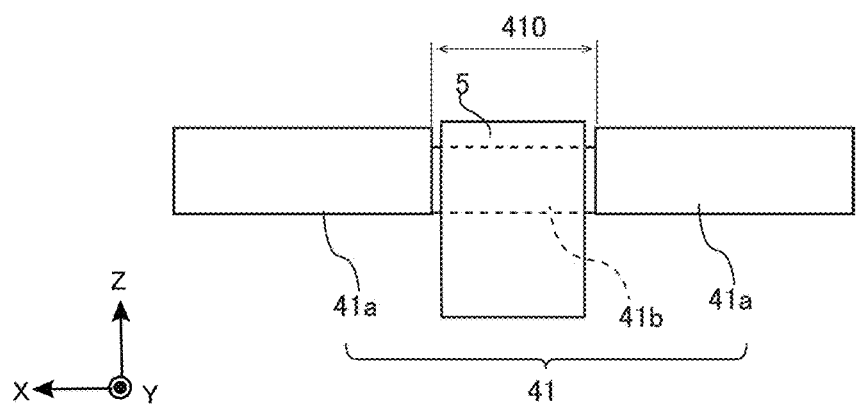
FIG. 5B is a plan view showing a part of a side surface of a bezel in the display device shown in FIG. 5A.

FIG. 5A is a sectional view of a display device taken at a position where a FPC 5 is provided, and FIG. 5B is a plan view of a bezel at the position where the FPC 5 is provided in FIG. 5A.

A bezel 41 provided in a display device 10a according to the present embodiment includes a conductive section 41a and an insulating section 41b, as shown in FIG. 5B. The insulating section 41b covers side surfaces and a rear surface of a display substrate D, similarly to the insulating section 4b in the first embodiment. As shown in FIG. 5A, at the position where the FPC 5 is disposed, the height of the insulating section 41b is lower than that of an active matrix substrate 1. As shown in FIGS. 5A and 5B, the conductive section 41a has an opening 410 in a region where the FPC 5 is disposed, and covers a region other than the opening 410 on the surface of the insulating section 41b covering the side surfaces of the display substrate D.

The FPC 5 covers the insulating section 41b at the position where the opening 410 is provided and is connected to the active matrix substrate 1. That is, the FPC 5 can be connected to the active matrix substrate 1 while preventing the conductive section 41a from being covered with the FPC 5.

In this case, the bezel 41 is connected to a proximity detection driving circuit 61 provided on a rigid substrate 6 via a FPC 51, as in the above-described first embodiment. The FPC 51 is connected to a region of the conductive section 41a other than the opening 410 by pressure bonding or the like.

Figure 5C:
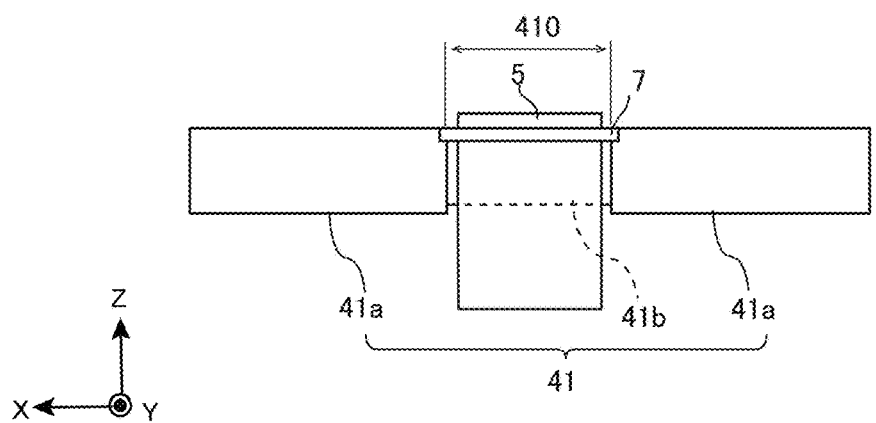
FIG. 5C is a plan view showing a state where an opening shown in FIG. 5B is connected using a conductive tape.

In FIG. 5B, since the conductive section 41a is not provided in the opening 410, the detection sensitivity in the opening 410 is reduced. Thus, as shown to FIG. 5C, both ends of the opening 410 are connected using a conductive tape 7 or the like over the FPC 5. With this configuration, the conductive tape 7 also can function as a proximity sensor similarly to the conductive section 41a, whereby the reduction in detection sensitivity at the position where the FPC 5 is provided can be decreased.

Although the display device according to the present invention has been described above by way of illustrative embodiments, the configuration of the display device according to the present invention is not limited to those described in the above-described embodiments and may be modified in various ways.

(1) The display devices 10 and 10*a* given as examples in the above-described embodiments are liquid crystal display devices. In each of the display devices 10 and 10*a*, in the case where a part of a backlight unit that covers the backlight provided on the bottom side of the active matrix substrate 1 is formed of an insulator such as a resin material, the part of the backlight unit formed of the resin material may function as the insulating section 4*b* or 41*b*.

(2) Although the above-described embodiments describe examples where the display devices 10 and 10*a* are liquid crystal display devices using liquid crystals, they may be display devices using organic electro-luminescence (EL). In this case, the display substrate is configured such that a light emitting layer is provided between an anode (scanning lines) and a cathode (data lines), and the side surfaces and the rear surface of the display substrate are covered with the bezel 4 or 41.

The invention claimed is:

1. A display device comprising:
a display substrate; and
a bezel that covers side surfaces and a rear surface of the display substrate, wherein
the bezel comprises: an insulating section that covers the side surfaces and the rear surface of the display substrate and has insulation properties; and a conductive section that is provided on a surface of the insulating section covering the side surfaces of the display substrate and has conductivity,
the conductive section is configured such that a predetermined voltage is applied thereto and a capacitance is formed between the conductive section and a dielectric object,
the display substrate is provided with a circuit element group for displaying an image and also for detecting a touched position and is connected to a control circuit for controlling the circuit element group, and
a height of the bezel at a position to which the control circuit is connected is lower than height of the bezel at other positions.

2. The display device according to claim 1,
wherein the display device comprises a driving circuit that is connected to the conductive section and is configured to apply the predetermined voltage to the conductive section and to detect a change in the capacitance.

3. A display device comprising:
a display substrate; and
a bezel that covers side surfaces and a rear surface of the display substrate, wherein
the bezel comprises: an insulating section that covers the side surfaces and the rear surface of the display substrate and has insulation properties; and a conductive section that is provided on a surface of the insulating section covering the side surfaces of the display substrate and has conductivity,
the conductive section is configured such that a predetermined voltage is applied thereto and a capacitance is formed between the conductive section and a dielectric object,
the conductive section has an opening, and
the display device comprises: a flexible substrate that is connected to the control circuit and is connected to the display substrate at a position where the opening is provided; and a conductive member that connects both ends of the opening so as to cover the flexible substrate.

4. The display device according to claim 3,
wherein the display device comprises a driving circuit that is connected to the conductive section and is configured to apply the predetermined voltage to the conductive section and to detect a change in the capacitance.

* * * * *